United States Patent [19]

Appelbaum et al.

[11] Patent Number: 5,039,578

[45] Date of Patent: Aug. 13, 1991

[54] METHOD FOR FABRICATING DEVICES IN III-V SEMICONDUCTOR SUBSTRATES AND DEVICES FORMED THEREBY

[75] Inventors: Amiram Appelbaum, Fanwood; Murray Robbins, Berkeley Heights, both of N.J.

[73] Assignee: AT&T Bell Laboratories, Murray Hill, N.J.

[21] Appl. No.: 484,452

[22] Filed: Feb. 20, 1990

Related U.S. Application Data

[63] Continuation of Ser. No. 878,077, Jun. 24, 1986, abandoned.

[51] Int. Cl.⁵ .............................................. B32B 9/00
[52] U.S. Cl. .................................... 428/704; 428/689; 428/699; 428/901; 428/927; 357/16; 357/20; 357/25; 357/70
[58] Field of Search ................ 428/689, 699, 704, 901, 428/929; 357/16, 20, 25, 70

[56] References Cited

U.S. PATENT DOCUMENTS

| | | | |
|---|---|---|---|
| 3,821,777 | 6/1974 | James | 148/D65 |
| 3,939,047 | 2/1976 | Tsunemitsu et al. | 357/67 |
| 4,121,177 | 10/1978 | Tsukada | 357/56 |
| 4,158,849 | 6/1979 | Harwylo | 357/30 |
| 4,268,584 | 5/1981 | Ahn et al. | 428/929 |
| 4,268,849 | 5/1981 | Gray et al. | 357/61 |
| 4,291,322 | 9/1981 | Clemens et al. | 357/65 |
| 4,361,718 | 11/1982 | Marcus et al. | 357/30 |
| 4,395,727 | 7/1983 | Lauterbach | 357/65 |
| 4,452,646 | 6/1984 | Zuleeg | 357/61 |
| 4,502,209 | 3/1985 | Eizenberg et al. | 357/67 |
| 4,503,131 | 3/1985 | Baudrand | 428/929 |
| 4,518,469 | 5/1985 | Ng et al. | 420/441 |
| 4,538,342 | 9/1985 | Camlibel et al. | 437/201 |
| 4,570,324 | 2/1986 | Smith et al. | 357/67 |
| 4,610,932 | 9/1986 | Haynes et al. | 428/929 |

*Primary Examiner*—Patrick J. Ryan
*Attorney, Agent, or Firm*—B. Tiegerman; P. V. D. Wilde; G. E. Books

[57] ABSTRACT

A new technique for forming non-rectifying electrical contacts to III-V semiconductor materials, without the use of dopants or of an alloying procedure, is disclosed. In accordance with this technique, an electrical contact is formed simply by depositing a region of material (onto the semiconductor material) having a composition which includes at least one metal element and at least one of three specific Group V elements, i.e., P, As, or Sb, and having a bulk electrical resistivity equal to or less than about 250 $\mu\Omega$-cm. Alternatively, a contact is formed by depositing nickel, or a nickel-containing material essentially free of gold and silver, and having a composition which does not include any of the three Group V elements. The nickel, or nickel-containing material, is then reacted with the substrate to form a compound having a composition which includes nickel as well as one of the three Group V elements.

16 Claims, 2 Drawing Sheets

METHOD FOR FABRICATING DEVICES IN III-V SEMICONDUCTOR SUBSTRATES AND DEVICES FORMED THEREBY

This application is a continuation of application Ser. No. 06/878077, filed on June 24, 1986, now abandoned.

BACKGROUND OF THE INVENTION

1. Field of the Invention

The invention pertains generally to a method for fabricating devices in III-V semiconductor substrates, as well as the resulting devices.

2. Art Background

A wide variety of devices, including discrete electronic devices, discrete opto-electronic devices (devices which produce an optical output in response to an electrical input, or vice versa), as well as integrated circuit and integrated optical devices, are now being fabricated, or have been proposed for fabrication, in substrates which include III-V semiconductor materials, because these materials exhibit a number of significant advantages. (A III-V semiconductor material, for purposes of this disclosure, is a semiconductor which includes Group III and Group V elements.) Included among these advantages is the fact that the mobility of electrons in the III-V semiconductor materials is much higher than in other semiconductor materials, such as silicon. As a consequence, electronic and opto-electronic devices, e.g., discrete transistors, lasers and integrated circuit devices, fabricated in the III-V semiconductor materials are capable of achieving much higher operating speeds than are the corresponding devices fabricated in, for example, silicon. In addition, the III-V semiconductor materials are direct bandgap materials, rather than indirect bandgap materials, as is the case with silicon. As is known, stimulate emission of light is only achievable in the former type of materials. Consequently, opto-electronic devices which depend, for their operation, on stimulated light emission, e.g., lasers, must be fabricated in direct bandgap materials. Moreover, direct bandgap materials exhibit much higher quantum efficiencies than indirect bandgap materials, and therefore the former materials are preferred for the fabrication of optical detector, optoelectronic devices, such as avalanche photodiode (APD) detectors.

The various types of devices fabricated in III-V semiconductor substrates include a variety of device components, such as active regions (a region of semiconductor material in a light-emitting opto-electronic device from which most of the light is emitted), sources, drains, p-n junctions and heterojunctions. (The term heterojunction, as used in this disclosure, denotes the interface between two semiconductor materials having different compositions or different doping levels.) Each such device also includes one or more metallic wires or metallic runners, generally fabricated from gold (Au), terminating in one or more non-rectifying, low specific contact resistance (LSCR) electrical contacts to the substrate, through which electrical signals are communicated to the device. (As used herein, the term non-rectifying, LSCR electrical contact denotes an electrical contact which permits electrical current flow in two opposed directions across the contact, and exhibits a specific contact resistance less than or equal to about $10^{-4}$ ohm-cm$^2$ in both directions. Significantly, such contacts to III-V semiconductor substrates are essential because the gold (per se) in the gold wires and gold runners yields a rectifying, rather than non-rectifying, electrical contact to III-V semiconductor materials.)

A non-rectifying, LSCR electrical contact to a III-V semiconductor substrate is conventionally formed by depositing, e.g., e-beam evaporating, a region of material which includes gold and a p-type (e.g., zinc or beryllium) or n-type (e.g., tin or germanium) dopant (depending upon whether the underlying semiconductor material is of p-type or n-type conductivity) onto the substrate. Because ultra-high-vacuum conditions are typically not employed, a native oxide (or oxides) of the semiconductor material tends to form on the surface of the substrate during the deposition procedure. Such native oxides are generally undesirable because their presence serves to increase specific contact resistance. Although the surface of the substrate is typically cleaned to remove these oxides, it is generally acknowledged that complete removal of the oxides is impossible. However, the presence of these oxides does not, in this instance, preclude the formation of a LSCR electrical contact. That is, after deposition, the gold-and-dopant-containing region is alloyed at temperatures as high as about 450 degrees Centigrade (C) for periods of time equal to about 7 minutes. Significantly, it is believed that this alloying procedure serves to drive the dopant through the native oxide (or oxides) and into the substrate, and electrically activate the dopant, to produce an electrical contact having a low specific contact resistance.

While the above alloying procedure does produce useful, non-rectifying, LSCR electrical contacts, this procedure does have a number of disadvantages, including undesirable interactions between the gold and the semiconductor substrate. For example, the relatively high temperatures involved in the alloying process result in the gold diffusing into the substrate, causing decomposition of the substrate material. As a consequence, and if, for example, the substrate material includes indium phosphide (InP), then the resulting free In and P (freed by the decomposition of the InP) tend to diffuse to the surface of the electrical contact, where they may undergo oxidation to form electrically insulating layers. In addition, the relatively high alloying temperatures also result in upward diffusion of the p- or n-type dopant to the surface of the electrical contact, where the dopant also tends to become oxidized to form an electrically insulating layer. Unless great care is taken to remove these insulating layers, the electrical contact will exhibit undesirably high series resistance.

The downward diffusion of gold into the substrate is also undesirable because the presence of gold in, for example, an active region constitutes a non-radiative recombination center, which serves to reduce the useful lifetime of light-emitting opto-electronic devices, such as lasers. In addition, the downward diffusion of gold into a substrate containing a relatively shallow p-n junction (a p-n junction having a depth equal to or less than about one-half micrometer) is undesirable because the gold penetrates through, and thus short circuits, these relatively shallow p-n junctions.

The relatively high alloying temperatures employed in forming the gold electrical contacts are further disadvantageous because they sometimes lead to significant, differential thermal expansions of the materials covering the substrate, which in turn leads to high stress in the substrate. Such high stress is undesirable because it leads to bending of the substrate, which makes conventional lithographic processing very difficult, if not impossible. This high stress often also leads to cracking and/or peeling of material layers overlying the substrate.

The above contact-fabrication procedure is further disadvantageous because it requires that the relative amounts of gold and dopant be precisely controlled to achieve the eutectic composition. Otherwise, the gold may not melt during the alloying process and/or the alloying process may not produce a sufficient or desired interaction between the dopant and the substrate, leading to an undesirably high specific contact resistance.

The above-described problems, resulting from the undesirable interactions between gold and III-V semiconductors, as well as scientific curiosity, have led to investigations of the interactions between various metals, including nickel, and III-V semiconductor substrates, such as InP. (Regarding these investigations see E. Hokelek et al., "A Study of Schottky Contacts on Indium Phosphide", Journal of Applied Physics, Vol. 54, No. 9, September 1983, pp. 5199-5205 and G. J. Hughes et al., "Nickel and Copper on Cleaved Indium Phosphide: Structure, Metallurgy and Electronic Properties, " Journal of Physics C: Solid State Physics, Vol. Properties", Journal of Physics C: Solid State Physics, Vol. 16 (1983), pp. 2391-2405.) In these investigations, the various metals were deposited onto indium phosphide substrates cleaved under ultra-high-vacuum conditions to avoid adsorption of contaminants, such as carbon and oxygen (which might increase specific contact resistance, or preclude the formation of non-rectifying contacts). As a result of these investigations, it was concluded, among other things, that nickel produces a Schottky barrier contact (a rectifying, metal-semiconductor contact) to InP and, moreover, that a relatively thin nickel phosphide layer is formed at the interface between the nickel and the InP. While no connection was made (in these investigations) between the existence of the nickel phosphide layer and the existence of the Schottky barrier contact, it has long been believed that a non-rectifying, LSCR contact between a metal, such as nickel, and a substrate of InP can only be achieved if the metal InP interface is rich in indium. But the interfacial nickel phosphide layer found in the investigations was, presumably, the result of nickel reacting, i.e. combining, with the phosphorus in the InP substrate. Such a reaction would necessarily produce free indium (In), which (under the resulting In concentration gradient) would diffuse to the surface of the nickel, resulting in a nickel-InP interface which is depleted of In. Significantly, a substantial amount of In was found (presumably the result of upward diffusion) on the surface of the nickel, in these investigations. Consequently, and on the basis of current beliefs, an In-depleted interface, produced by the formation of an interfacial, nickel phosphide layer, would preclude the formation of a non-rectifying, LSCR contact, and would be consistent with the Schottky barrier contacts found in the investigations.

Thus, those engaged in the development of III-V semiconductor devices have sought, and continue to seek, new materials and new methods for forming non-rectifying, LSCR electrical contacts to III-V semiconductor substrates.

SUMMARY OF THE INVENTION

The invention involves the finding that simply depositing any one of a specific class of compounds onto a p- or n-type III-V semiconductor substrate, having a doping level equal to or greater than about $10^{17}$ per cubic centimeter ($cm^{-3}$), yields a non-rectifying, LSCR electrical contact to the substrate. The members of this class of compounds are those having compositions which include at least one metal element and at least one of three specific Group V elements, i.e., phosphorus (P), arsenic (As) or antimony (Sb), and having bulk electrical resistivities equal to or less than about 250 micro-ohm-centimeters ($\mu\Omega$-cm), and preferably equal to or less than about 100 $\mu\Omega$-cm. In addition, the invention involves the finding that depositing nickel, or a nickel-containing material which is essentially free of gold and silver and does not include any of the above three Group V elements, onto a III-V semiconductor material, and then reacting the nickel, or nickel-containing material with the semiconductor material to produce a compound having a composition which includes nickel as well as at least one of the three Group V elements, also yields a non-rectifying, LSCR electrical contact. Significantly, these contacts are formed without the use of dopants and without the need for an alloying procedure. Moreover, these contacts are formed (through deposition or deposition followed by chemical reaction) without the use of ultra-high-vacuum conditions, and despite the (presumed) adsorption of contaminants and formation of native oxides of the semiconductor material.

By way of example, a non-rectifying, LSCR electrical contact to a semiconductor substrate of, for example, InP is readily formed simply by depositing a region of nickel phosphide directly onto the substrate. Alternatively, a region of nickel is deposited onto the substrate and allowed to spontaneously react with substrate material to form a relatively thin, interfacial layer of nickel phosphide. Contrary to the conventional wisdom, the (presumably) In-depleted interface between the deposited nickel and the semiconductor substrate does not preclude formation of a non-rectifying, LSCR electrical contact.

After being formed, the inventive LSCR electrical contacts are often subjected to relatively high temperatures during various device fabrication steps. Depending upon the particular compositions of the materials employed in the electrical contacts, these materials may (under the influence of the relatively high temperatures) undergo reactions with the substrate material. As a consequence, Group III and/or Group V elements in the substrate may be freed to diffuse to the surface of the electrical contacts, where they may undergo oxidation to form electrically insulating layers.

To avoid the possibility of reactions during high temperature processing, the compositions of the materials employed in the inventive LSCR electrical contacts are preferably chosen (in accordance with a two-step procedure, described below) to have heats of formation which preclude such reactions.

Significantly, it has been found that non-rectifying, LSCR electrical contacts having compositions which preclude reactions with the III-V semiconductor substrates, which are amorphous, and have thicknesses equal to or greater than about 200 Angstroms (Å), are effective barriers to the diffusion of gold (from overlying gold regions, used to facilitate bonding of gold wires or runners) into underlying substrates. As a consequence, light-emitting opto-electronic devices which include such contacts have significantly increased lifetimes. Moreover, LSCR electrical contacts to relatively shallow p-n junctions are now readily formed, without short-circuiting the p-n junctions.

BRIEF DESCRIPTION OF THE DRAWINGS

The invention is described with reference to FIGS. 1-6, which depict the steps involved in fabricating a channel-substrate-buried-heterostructure indium phosphide laser, using the inventive device fabrication method.

DETAILED DESCRIPTION

Figure 1:
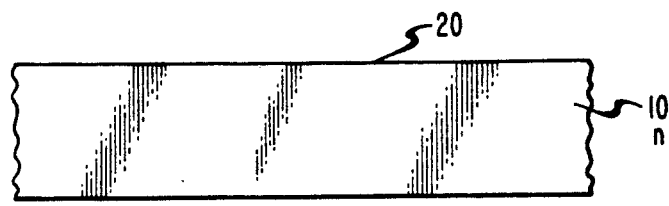

The invention involves a method for fabricating devices in III-V semiconductor substrates, which is distinguished from previous such methods in that it includes a new technique for forming non-rectifying, LSCR electrical contacts to these substrates. The invention also involves the devices, e.g., transistors, lasers, light-emitting diodes, photodetectors, integrated circuits and integrated optical devices, resulting from the inventive method.

As discussed, the invention involves the finding that non-rectifying, LSCR electrical contacts to p- or n-type III-V semiconductor substrates, having doping levels equal to or greater than about $10^{17}cm^{-3}$, are readily formed, using either of two techniques. In the first technique, an electrical contact is formed by first cleaning the substrate (using conventional degreasers and oxide strippers), and then simply depositing, e.g., DC magnetron sputtering, any one of a specific class of compounds onto the substrate. The members of this class of compounds are those having compositions which include at least one metal element and at least one of three specific Group V elements, i.e., P, As or Sb, and having bulk resistivities equal to or less than about 250 $\mu\Omega$-cm, and preferably equal to or less than about 100 $\mu\Omega$-cm. The compounds which meet these requirements are typically (although not exclusively) binary, ternary, or quaternary metallic compounds which include, for example, $Ni_3P$, $Ni_2P$, $NiP$, $Ni_{11}In_4P_2$, $Ni_3As$, $Ni_2As$, $NiAs$, $Ni_3Sb$, $Ni_2Sb$, and $NiSb$.

Significantly, the compound deposition, referred to above, need not take place under ultra-high-vacuum conditions, and, if possible, even ordinary room atmospheric conditions are useful. Surprisingly, and even though contaminants are presumably adsorbed, and native oxides of the semiconductor material are presumed to form, during the time interval between cleaning and deposition, the resulting electrical contact is highly useful, i.e., exhibits a specific contact resistance equal to or less than about $10^{-4}$ohm-cm$^2$ to current flow in two opposed directions.

In the second technique, a non-rectifying, LSCR electrical contact to a III-V semiconductor substrate is formed by (cleaning the substrate and) depositing nickel, or a nickel-containing material which is essentially free of gold and silver and does not include any of the three Group V elements, onto the substrate. Then the deposited material is either induced to react (e.g., heat is supplied), or allowed to spontaneously react (i.e., no external stimulus, such as heat, is supplied), with the substrate to form a compound having a composition which includes both nickel as well as one (or more) of the three Group V elements. (Generally, it cannot be predicted whether any particular set of deposition conditions will result in a spontaneous reaction between the deposited material and the substrate material to produce the desired compound. However, the presence or absence of the desired compound is readily detected using conventional techniques such as Auger electron spectroscopy. Thus, the utility of a particular deposition procedure for achieving the desired spontaneous reaction is readily determined empirically.)

By way of example, an electrical contact to a substrate of InP is formed by depositing, e.g., e-beam evaporating, a region of nickel directly onto the substrate, and then allowing the nickel to spontaneously react with the substrate (during and after the deposition procedure) to form a relatively thin, interfacial layer of nickel phosphide. (The thickness of this interfacial layer is typically several Angstroms.) If a thicker layer of nickel phosphide is desired, then the nickel-bearing InP-substrate should, for example, be heated, to react additional nickel with the substrate material. In this regard, it has been found that a relatively thick layer of essentially pure $Ni_2P$ is readily formed by carrying out the heating process (at a temperature of, for example, 300 degrees C) in an atmosphere of forming gas, i.e., an atmosphere which includes about 15 percent (by volume) of $H_2$ and about 85 percent of $N_2$.

It is contemplated that the two techniques, described above, yield non-rectifying, LSCR contacts because Group III elements in the substrate form chemical bonds with the Group V elements in the contacts. Moreover, it is beleived that electron-transport across the contact-substrate interface is largely due to thermionic emission.

Significantly, the nickel-containing electrical contacts formed by deposition and reaction are typically crystalline in nature. By contrast, the electrical contacts formed by deposition, alone, are either crystalline or amorphous in nature, depending upon deposition conditions. (For purposes of the invention, a material is amorphous if it either has no grains or, if grains are present, their dimensions are equal to or less than about 500Å.) For example, if an electrical contact of $Ni_2P$ is deposited using conventional DC magnetron sputtering techniques, then a relatively low substrate-support temperature (e.g., $-100$ degrees Centigrade) and/or a relatively low sputtering voltage (e.g., 280 volts) yields amorphous $Ni_2P$. On the other hand, a substrate-support maintained at room temperature ($\approx 23$ degrees Centigrade) and/or a relatively high sputtering voltage (e.g., 300 volts) yields crystalline $Ni_2P$. This distinction between the natures of the electrical contacts results in different contact properties. That is, crystalline contacts typically exhibit lower bulk resistivities than amorphous contacts, which leads to reduced series resistance. On the other hand, as discussed more fully below, amorphous contacts are better diffusion barriers than crystalline contacts.

The inventive method for fabricating devices often involves relatively high temperature processing subsequent to the fabrication of a non-rectifying LSCR electrical contact (or contacts). Such high temperature processing may result in chemical reactions between the material of the electrical contact and the substrate material. As a consequence, some Group III and/or Group V elements in the substrate may be freed to diffuse to the surface of the electrical contact, where they may be oxidized to form electrically insulating layers. Such layers may lead to relatively high series resistance.

Preferably, to avoid the high temperature reactions, discussed above, the composition of the material employed in the inventive electrical contact is chosen in accordance with a two-step procedure. In the first step, those compositions are identified which include P, As, or Sb (and nickel, if the contact is formed by deposition and reaction), have bulk resistivities less than or equal to about 250 $\mu\Omega$-cm, and have heats of formation per metal atom (kilocalories per metal atom) which are more negative than that of the substrate composition, i.e., in magnitude (absolute value), the heats of formation per metal atom of the potentially useful compositions are larger than that of the substrate composition. (If a composition includes more than one metal element, then the average heat of formation per metal atom is employed.) Compositions which meet this requirement are (by definition) thermodynamically more stable than the substrate composition. However, one or more of these compositions might still react (under the influence of the relatively high temperatures) with substrate material to form an even more stable composition. To avoid this possibility, these particular compositions are identified and weeded out. That is, during the second step, the most stable composition, i.e., the composition having the most negative heat of formation per metal atom, is initially identified. Then, the magnitude (the absolute value) of the difference between the heat of formation per metal atom of each composition (identified in the first step) and the most stable composition is calculated. If, for any particular composition, this magnitude is less than the magnitude (absolute value) of the heat of formation per metal atom of the semiconductor composition, then (thermodynamically) this particular composition is precluded from reacting with the substrate to form a more stable composition. Alternatively, and regardless of this requirement, if a particular composition has a larger relative amount of the Group V element than the most stable composition, then this composition too is precluded from reacting with the substrate.

By way of example, if the semiconductor substrate is of InP, then the first step (of the two-step procedure) implies that the potentially useful compositions include $Ni_6P_5$, $Ni_3P_2$, and $Ni_2P$. Significantly, $Ni_6P_5$ is the most stable of these compositions. Applying the criterion of the second step implies that all of these compositions are thermodynamically stable, i.e., will not react with InP. Moreover, NiP is also useful (will not react with InP) because it contains a larger relative amount of P than $Ni_6P_5$.

Typically, after an electrical contact is formed, a region of gold (and, perhaps, other materials) is deposited onto the contact to facilitate the bonding of gold wires and/or gold runners to the electrical contact. Significantly, it has been found that material regions which are thermodynamically stable, as defined by the above two-step procedure, are amorphous, and have thicknesses equal to or greater than about 200 Angstroms are effective barriers to undesirable interdiffusion of gold (from the overlying gold region) and the underlying semiconductor material. (Such interdiffusion is undesirable for the reasons given above, in relation to conventional gold electrical contacts.) Thus, such materials are useful both as diffusion barriers and as non-rectifying, LSCR electrical contacts. In fact, such material regions are highly useful just as diffusion barriers interposed between any of a variety of electrical contacts and, for example, the corresponding, overlying gold regions.

Among other advantages, the inventive technique for forming electrical contacts makes it possible to form a relatively shallow electrical contact to a relatively shallow p-n junction or a relatively shallow heterojunction (a p-n junction or heterojunction having a depth less than or equal to about ½ micometer), without short-circuiting the p-n junction or heterojunction. (For purposes of the invention, the depth of a p-n junction, or of a heterojunction, is defined with reference to the device surface, or interface between different material regions of the device, on which the electrical contact is formed, or from, or through which, the electrical contact extends. That is, the depth of a p-n junction formed, for example, by producing a p-type region within an n-type substrate, is defined as the length of a perpendicular extending from a least-squares-fit planar approximation to the above reference surface or reference material interface to the lowest point where the dopant concentration in the p-type region is equal to the dopant concentration in the n-type substrate. On the other hand, the depth of a heterojunction formed by different semiconductor materials is defined as the length of a perpendicular extending from the above least-squares-fit planar approximation to the lowest point of the interface between the two materials, as determined using, for example, Auger electron spectroscopy. Further, the depth of a heterojunction formed by semiconductor materials having the same composition but different doping levels is as defined above, except that the perpendicular extends to the lowest point of the interface between the two materials where the doping level is the average of the doping levels in the two materials as determined, for example, by SIMS analysis.) That is, and as discussed above, the alloying procedure involved in forming a conventional gold contact typically results in gold being diffused downwardly into the semiconductor substrate. If the electrical contact is to a substrate region containing a p-n junction or heterojunction having a depth equal to or less than about ½ micrometer, then the gold invariably diffuses more than about ½ micrometer, i.e., the gold diffuses into, and through, the junction, short-circuiting the junction. By contrast, the inventive technique involves no alloying procedure. Thus, provided the contact material is thermodynamically stable, amorphous, and has a thickness equal to or greater than about 200 Angstroms, both gold and contact material are largely precluded from diffusing downwardly into the semiconductor substrate into electrical contact with the p-n junction or heterojunction.

Yet another advantage of the invention is the fact that it permits the useful lifetimes of light-emitting, discrete opto-electronic and integrated optical devices to be significantly increased. That is, by forming the material compositions with thicknesses equal to or greater than about 200 Angstroms, the downward diffusion of gold into the active regions of such devices is largely precluded. As a consequence, the formation of nonradiative recombination centers is largely avoided.

As a pedagogic aid to an even more complete understanding of the invention, the application of the inventive device fabrication method to the formation of a channel-substrate-buried-heterostructure InP laser, is described below.

Figure 2:
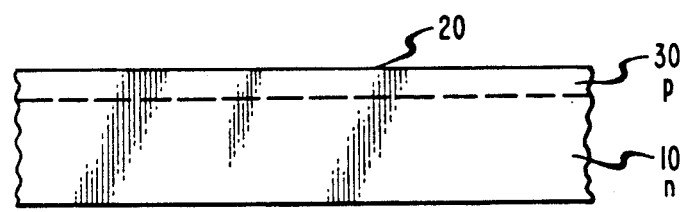
Figure 3:
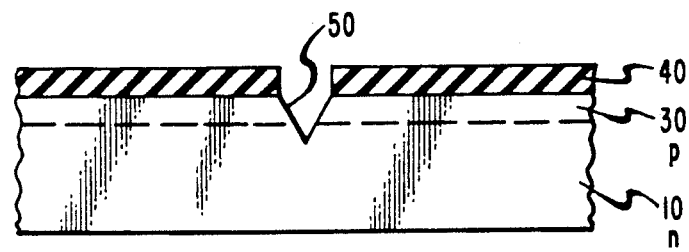
Figure 4:
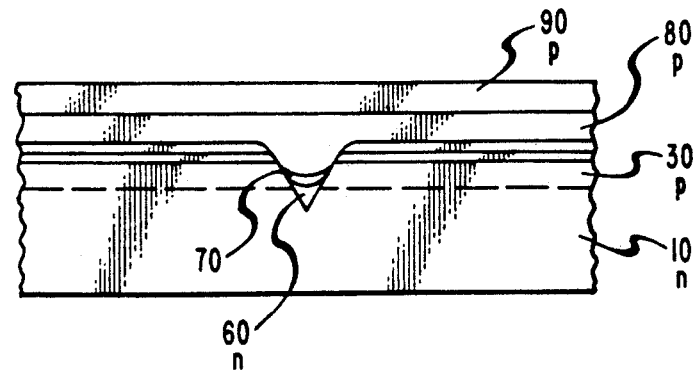
Figure 5:
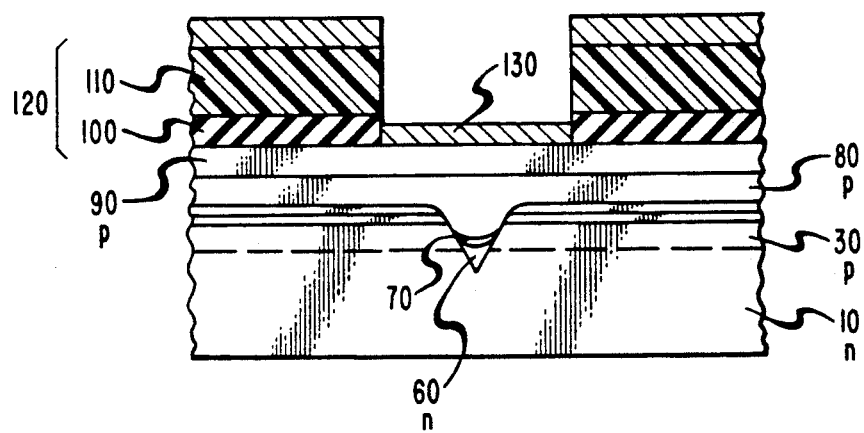
Figure 6:
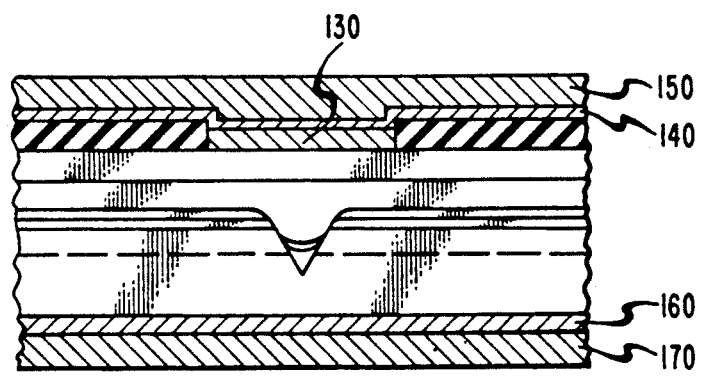

With reference to FIGS. 1-6, the laser is formed in a substrate which initially includes just a bulk region 10 of, for example, n-type InP, e.g., a wafer of n-type InP. The doping level within the bulk region 10 is, for example, about $8 \times 10^{17}$ cm$^{-3}$.

The first step in the fabrication of the laser is to form a blocking layer 30, i.e., a layer which blocks the flow of currents external to the active region (described below) into the bulk region 10, adjacent to the upper surface 20. The blocking layer 30 is formed, for example, by diffusing a p-type dopant, such as cadmium, into the bulk region 10. The doping level within the blocking layer should be equal to or greater than about $4 \times 10^{18}$ cm$^{-3}$ to avoid the flow of undesirable leakage currents across the blocking layer and into the bulk region 10. In addition, the thickness of the blocking layer 30 ranges from about 0.5 $\mu$m to about 1.5 $\mu$m. Thicknesses less than about 0.5 $\mu$m are undesirable because they too result in undesirable leakage currents across the blocking layer. Thicknesses greater than about 1.5 $\mu$m are undesirable because they result in lasers which require undesirably large amounts of electrical power to achieve stimulated light emission.

Alternatively, the blocking layer 30 is formed by depositing a layer of semi-insulating InP onto the surface 20, using conventional metal organic chemical vapor deposition techniques. Here, the term semi-insulating means that the deposited semiconductor material has a bulk resistivity equal to or greater than about $10^7$ ohm-cm.

After the formation of the blocking layer 30, an etch mask 40 is formed on the upper surface of the blocking layer. This etch mask includes, for example, a layer of silicon dioxide which is deposited onto the blocking layer 30 using conventional plasma deposition techniques. The etch mask is formed by patterning the silicon dioxide layer using, for example, conventional lithographic techniques. The thickness of the silicon dioxide layer ranges from 1100 Å to about 1300 Å. Thicknesses less than about 1100 Å are undesirable because they result in an undesirably large number of pinholes in the silicon dioxide. On the other hand, thicknesses greater than about 1300 Å are undesirable because they make it difficult to achieve the desired sidewall inclination of the V-groove, describe below.

With the etch mask 40 in place, a crystallographic, chemical etchant, e.g., 3:1 HCl:H$_3$PO$_4$, is applied to the exposed region of the substrate surface to form a V-groove 50. This V-groove 50 serves to channel, and confine, the electrical current to the active region of the laser. The etchant is chosen to expose (111) facets of the crystalline substrate. Moreover, the width of the V-groove ranges from about 3.5 micrometers ($\mu$m) to about 4.5 $\mu$m. Widths less than about 3.5 $\mu$m, or greater than about 4.5 $\mu$m, are undesirable because they result in devices which require an undesirably large amount of electrical power to achieve stimulated emission of light.

After the etching of the V-groove 50, and after removing (using conventional chemical etchants) the etch mask 40, an n-type InP buffer region 60 is grown in the bottom of the V-groove 50 (as well as on the surface of the blocking layer 30) using conventional liquid phase epitaxy (LPE) techniques. The thickness of the buffer region, as measured from the bottom of the V-groove, typically ranges from about 0.5 $\mu$m to about 1 $\mu$m. Unlike the sidewalls of the V-groove, the buffer region 60 is largely free of contaminants and defects.

An undoped, active region 70 of III-V semiconductor material now grown on the buffer region 60 in the V-groove 50 (as well as on the upper surface of the blocking layer 30) using conventional LPE techniques. To ensure that electrical conduction is largely confined to the active region 70, the bandgap of the semiconductor material employed in the active region should be less than that of the semiconductor material employed both in the blocking layer 30 and in the cladding layer (discussed below). One such useful (active region) material is, for example, (undoped) indium gallium arsenide phosphide (InGaAsP). The thickness of the active region ranges from about 0.2 $\mu$m to about 0.7 $\mu$m. Thicknesses less than about 0.2 $\mu$m are undesirable because such thin regions result in undesirably little stimulated light emission from the laser. Thicknesses greater than about 0.7 $\mu$m are undesirable because they result in lasers which require an undesirably large amount of electrical power to achieve stimulated emission of light.

The growth of the active region 70 is followed by the LPE-growth of a cladding layer 80 and of a cap layer 90. The former is, for example, of p-type InP, while the latter is of p-type indium gallium arsenide (InGaAs). The thickness of the cladding layer, and of the cap layer, is typically about 1 $\mu$m.

A (patterned) deposition mask 120 is now formed on the upper surface of the cap layer 90. As discussed below, the deposition mask permits the electrical contact to the laser to be formed in vertical alignment with the active region 70. The deposition mask 120 includes a layer 100 of silicon dioxide which is deposited onto the cap layer 90 using, for example, conventional plasma deposition techniques. In addition, the deposition mask includes a layer 110 of, for example, photoresist. The thickness of the silicon dioxide layer is typically about 0.3 $\mu$m, while the thickness of the photoresist is typically about 1 $\mu$m. In forming the deposition mask, the photoresist is initially patterned, i.e., a region of the photoresist overlying the active region 70 is removed, using conventional exposure and development techniques. The width of this region (and thus the ultimate width of the electrical contact) is typically about 6 $\mu$m. The patterned photoresist layer is then used as an etch mask during the etching of the silicon dioxide layer 100, resulting in the removal of a region of the silicon dioxide layer which also overlies the active region 70. Useful silicon dioxide-etchants include, for example, buffered HF.

An electrical contact to the laser is now produced by depositing, e.g., sputtering, an amorphous region 130 of, for example, Ni$_6$P$_5$ onto the exposed upper surface of the cap layer 90. Preferably, the thickness of the region 130 is equal to a greater than about 200 Angstroms, to avoid the downward diffusion of gold (from a gold region subsequently formed on the region 130).

Preferably, to enhance the adhesion of the region 130 to the cap layer 90, a layer 140 of titanium is deposited onto the upper surface of the region 130 as well as onto the upper surface of the silicon dioxide layer 100. The thickness of the titanium layer is typically about 50 Angstroms.

With the completion of the electrical contact, a layer 150 of gold is deposited onto the upper surface of the titanium layer 140, to facilitate the subsequent bonding of a gold wire to the electrical contact. The thickness of the gold layer is typically about 1 $\mu$m.

A second electrical contact is, of course, needed to apply voltages to the laser. This second contact is formed on the backside of the substrate by initially thinning the bulk region 10 (typically by about 75 $\mu$m) using conventional mechanical lapping, and then depositing successive layers 160 and 170 of, respectively, Ni$_6$P$_5$ and gold, onto the backside, as described above.

The bulk region 10, which is now an integral part of the laser, is typically a portion of a wafer which, at this point, is cleaved (using conventional techniques) to form the end mirror-facets of the laser device. The laser device is separated from the wafer using saw cuts transverse to the mirror-facets.

The final steps in the fabrication of the laser typically involve soldering (at temperatures ranging from about 200 degrees C. to about 350 degrees C.) the laser to a stud which serves both as a heat sink for the device, as well as a device carrier or package. Then, gold wires are bonded to the gold regions 150 and 170 covering the top and bottom of the laser.

EXAMPLE 1

The lower surface of a one-half-inch diameter indium phosphide wafer, of n-type conductivity, and having a doping level of $8 \times 10^{17}$ cm$^{-3}$, was cleaned using conventional degreasers and oxide strippers. Using conventional e-beam evaporation techniques, successive layers of gold, germanium, and gold were deposited onto the cleaned lower surface. The thicknesses of these layers were, respectively, 50 Å, 150 Å, and 1000 Å.

The upper surface of the wafer was degreased, and a layer of SiO$_2$, having a thickness of 5000 Å, was plasma deposited onto the upper surface. A layer of photoresist was spin-deposited onto the SiO$_2$, and conventionally lithographically patterned to remove circular regions of photoresist having diameters ranging from about 20 μm to about 200 μm. Using the patterned photoresist as an etch mask, the silicon dioxide was chemically etched with buffered HF to expose corresponding circular surface areas of the indium phosphide.

A layer of Ni$_2$P, having a thickness of about 1000 Å, was deposited onto the exposed, circular surface areas of the wafer, as well as onto the photoresist, using DC magnetron sputtering. The gas within the sputtering chamber was argon, the pressure of the gas was 12 millitorr, and the DC voltage was 300 volts. The Ni$_2$P-covered photoresist was then stripped from the wafer using conventional chemical etchants.

The conventional Cox and Strack technique (see R. H. Cox and H. Strack, Solid State Electronics, Vol. 10, page 1213 (1967)) was employed to measure the specific contact resistance at each of the Ni$_2$P-covered regions of the wafer, using electrical currents of opposite polarity. In all cases, the specific contact resistance was equal to or less than about $3 \times 10^{-6}$ ohm-cm$^2$.

EXAMPLE 2

A one-half-inch indium phosphide wafer was processed, as in Example 1, except that a different technique was used to form the circular regions of Ni$_2$P on the upper surface of the wafer. That is, after the photoresist and SiO$_2$ were patterned, a 1000 Å-thick layer of Ni was e-beam evaporated onto the exposed, circular surface areas of the wafer, as well as onto the photoresist. After stripping the Ni-covered photoresist, the wafer was placed in an atmosphere of forming gas, and heated to a temperature of 300 degrees C. for 30 minutes to produce circular regions of Ni$_2$P, having thicknesses of about 1300 Å, on the wafer.

Using the technique employed in Example 1, the specific contact resistance, in all cases, was found to be equal to or less than about $3 \times 10^{-6}$ ohm-cm$^2$.

What is claimed is:

1. A semiconductor device, comprising a body of III–V semiconductor material; and
   a non-rectifying, low-specific-contact-resistance electrical contact to a region of said body of III–V semiconductor material having a doping level equal to or greater than about $10^{17}$cm$^{-3}$, CHARACTERIZED IN THAT
   said electrical contact includes in physical contact with said region of said body a region of material essentially free of any compound which includes both a metal element and aluminum, gallium or indium and said region of material having a composition which includes at least one metal element and at least one element chosen from the group consisting of phosphorus, arsenic and antimony and further having a bulk resistivity less than or equal to about 250 μΩ-cm.

2. The device of claim 1 wherein said bulk resistivity is equal to or less than about 100 μΩ-cm.

3. The device of claim 1 wherein said metal element of said composition is nickel.

4. The device of claim 1 wherein said composition is chosen to preclude chemical reactions between said region of material and said semiconductor material.

5. The device of claim 1 wherein said region of material is amorphous.

6. The device of claim 1 wherein said region of material has a thickness equal to or greater than about 200 Angstroms.

7. The device of claim 1, said device being a discrete electronic device.

8. The device of claim 7, wherein said discrete electronic device is a transistor.

9. The device of claim 1, said device being an integrated circuit device.

10. The device of claim 1, said device being an optoelectronic device.

11. The device of claim 10, wherein said opto-electronic device is a laser.

12. The device of claim 10, wherein said opto-electronic device is a light-emitting diode.

13. The device of claim 10, wherein said opto-electronic device is a photodetector.

14. The device of claim 1, said device being an integrated optical device.

15. The device of claim 1 wherein said region of material is amorphous and has a thickness equal to or greater than about 200 angstroms and further comprising a layer of gold in electrical contact with said non-rectifying , low-specific-contact-resistance electrical contact.

16. The device of claim 15 further comprising a layer of titanium disposed between said region of material and said layer of gold.

* * * * *

UNITED STATES PATENT AND TRADEMARK OFFICE
CERTIFICATE OF CORRECTION

PATENT NO. : 5,039,578

DATED : August 13, 1991

INVENTOR(S) : Amiram Appelbaum and Murray Robbins

It is certified that error appears in the above-identified patent and that said Letters Patent is hereby corrected as shown below:

Column 3, line 22, delete [Prop-];
line 23, delete the entire line.

Column 10, line 45, "a greater" should read --or greater--.

Signed and Sealed this

Twenty-seventh Day of October, 1992

Attest:

DOUGLAS B. COMER

Attesting Officer

Acting Commissioner of Patents and Trademarks